(12) United States Patent
Zitzmann et al.

(10) Patent No.: US 10,842,020 B2
(45) Date of Patent: *Nov. 17, 2020

(54) SUBSTRATE FOR A SENSOR ASSEMBLY FOR A RESISTANCE THERMOMETER, SENSOR ASSEMBLY, RESISTANCE THERMOMETER AND METHOD OF PRODUCING SUCH A SUBSTRATE

(71) Applicant: TE Connectivity Sensors Germany GmbH, Dortmund (DE)

(72) Inventors: Heinrich Zitzmann, Lauf a.d. Pegnitz (DE); Horst Sirtl, Lauf a.d. Pegnitz (DE); Dirk Nusse, Dortmund (DE)

(73) Assignee: TE CONNECTIVITY SENSORS GERMANY GMBH, Dortmund (DE)

( * ) Notice: Subject to any disclaimer, the term of this patent is extended or adjusted under 35 U.S.C. 154(b) by 411 days.

This patent is subject to a terminal disclaimer.

(21) Appl. No.: 15/364,926

(22) Filed: Nov. 30, 2016

(65) Prior Publication Data

US 2017/0156204 A1  Jun. 1, 2017

(30) Foreign Application Priority Data

Dec. 1, 2015 (DE) .................. 10 2015 223 951

(51) Int. Cl.
| | | |
|---|---|---|
| *G01K 7/00* | (2006.01) | |
| *H05K 1/02* | (2006.01) | |
| *G01K 7/18* | (2006.01) | |
| *H05K 1/03* | (2006.01) | |
| *H05K 1/18* | (2006.01) | |
| *H05K 3/46* | (2006.01) | |

(52) U.S. Cl.
CPC ............. *H05K 1/0271* (2013.01); *G01K 7/18* (2013.01); *H05K 1/0306* (2013.01); *H05K 1/18* (2013.01); *H05K 3/46* (2013.01); *H05K 2201/068* (2013.01); *H05K 2201/10151* (2013.01)

(58) Field of Classification Search
CPC combination set(s) only.
See application file for complete search history.

(56) References Cited

U.S. PATENT DOCUMENTS

| | | | |
|---|---|---|---|
| 5,172,466 A | | 12/1992 | Friese et al. |
| 5,831,512 A | * | 11/1998 | Wienand ................ G01K 7/183 338/25 |
| 5,846,891 A | * | 12/1998 | Son ...................... C04B 35/117 501/127 |

(Continued)

FOREIGN PATENT DOCUMENTS

JP    04265828 A    9/1992

OTHER PUBLICATIONS

EPO translation of WO2010118813.*

(Continued)

*Primary Examiner* — Alessandro V Amari
*Assistant Examiner* — Nasir U. Ahmed

(57) ABSTRACT

A substrate for a sensor assembly of a resistance thermometer is disclosed. The substrate has a plurality of first layers formed of a first material and a plurality of second layers formed of a second material. The first and second layers are disposed over one another such that a thermal coefficient of expansion of the substrate is approximately equal to the thermal coefficient of expansion of platinum.

22 Claims, 5 Drawing Sheets

(56) References Cited

U.S. PATENT DOCUMENTS

| | | | | |
|---|---|---|---|---|
| 2002/0000598 A1* | 1/2002 | Kang | ................ | C23C 16/34 |
| | | | | 257/301 |
| 2004/0040843 A1* | 3/2004 | Weyl | ................ | G01N 27/4077 |
| | | | | 204/424 |
| 2005/0062581 A1* | 3/2005 | Koyama | ................ | G01K 7/22 |
| | | | | 338/22 R |
| 2007/0110124 A1* | 5/2007 | Shiraki | ................ | G01K 1/08 |
| | | | | 374/208 |
| 2009/0122506 A1* | 5/2009 | Sugimoto | ................ | B32B 18/00 |
| | | | | 361/811 |
| 2010/0117784 A1* | 5/2010 | Holoubek | ................ | G01K 7/18 |
| | | | | 338/22 R |
| 2015/0292955 A1 | 10/2015 | Wienand et al. | | |

OTHER PUBLICATIONS

EPO translation of DE4300084.*
German Office Action, dated Sep. 5, 2016, 5 pages.
Abstract of JPH04265828, dated Sep. 22, 1992, 2 pages.

\* cited by examiner

US 10,842,020 B2

SUBSTRATE FOR A SENSOR ASSEMBLY FOR A RESISTANCE THERMOMETER, SENSOR ASSEMBLY, RESISTANCE THERMOMETER AND METHOD OF PRODUCING SUCH A SUBSTRATE

CROSS-REFERENCE TO RELATED APPLICATION

This application claims the benefit of the filing date under 35 U.S.C. § 119(a)-(d) of German Patent Application No. 102015223951.9, filed on Dec. 1, 2015.

FIELD OF THE INVENTION

The present invention relates to a sensor assembly, and more particularly, to a substrate for a sensor assembly of a resistance thermometer.

BACKGROUND

Resistance thermometers known in the art have a measuring structure made of platinum, which is arranged on a substrate. The substrate and the measuring structure in known resistance thermometers have different thermal coefficients of expansion. When known resistance thermometers are stressed by abrupt changes in temperature, alterations and damage, which act on the entire measuring structure and falsify the measurement values as a result, can occur at the boundary layer between the substrate and the measuring structure. Consequently, a temperature measurement made by the resistance thermometer becomes more unreliable over time.

SUMMARY

An object of the invention, among others, is to provide a substrate for a sensor assembly of a resistance thermometer which does not suffer alterations or damage at a boundary layer and provides stable measurements in the long term. The disclosed substrate has a plurality of first layers formed of a first material and a plurality of second layers formed of a second material. The first and second layers are disposed over one another such that a thermal coefficient of expansion of the substrate approximately equal to the thermal coefficient of expansion of platinum.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
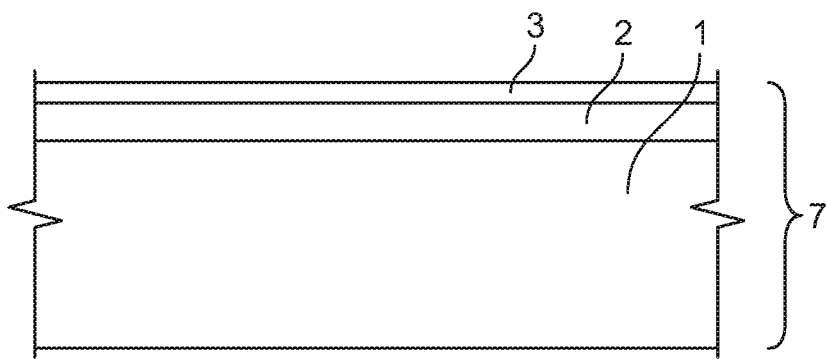
FIG. 1 is a sectional view of a sensor assembly according to the invention.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete, and will fully convey the concept of the invention to those skilled in the art.

A sensor assembly 7 for a resistance thermometer according to the invention is shown generally in FIG. 1. The sensor assembly 7 comprises a substrate 1 on which there is arranged a measuring structure 2 made of platinum. The measuring structure 2 is in turn covered by a cover layer 3.

The substrate 1 serves as a support for the measuring structure 2, which can be very fragile. The measuring structure 2, in an embodiment of the invention, is a meandering structure. The resistance of the measuring structure 2 changes depending on the temperature. This change in resistance can be measured and the temperature can be deduced from this.

Figure 2:
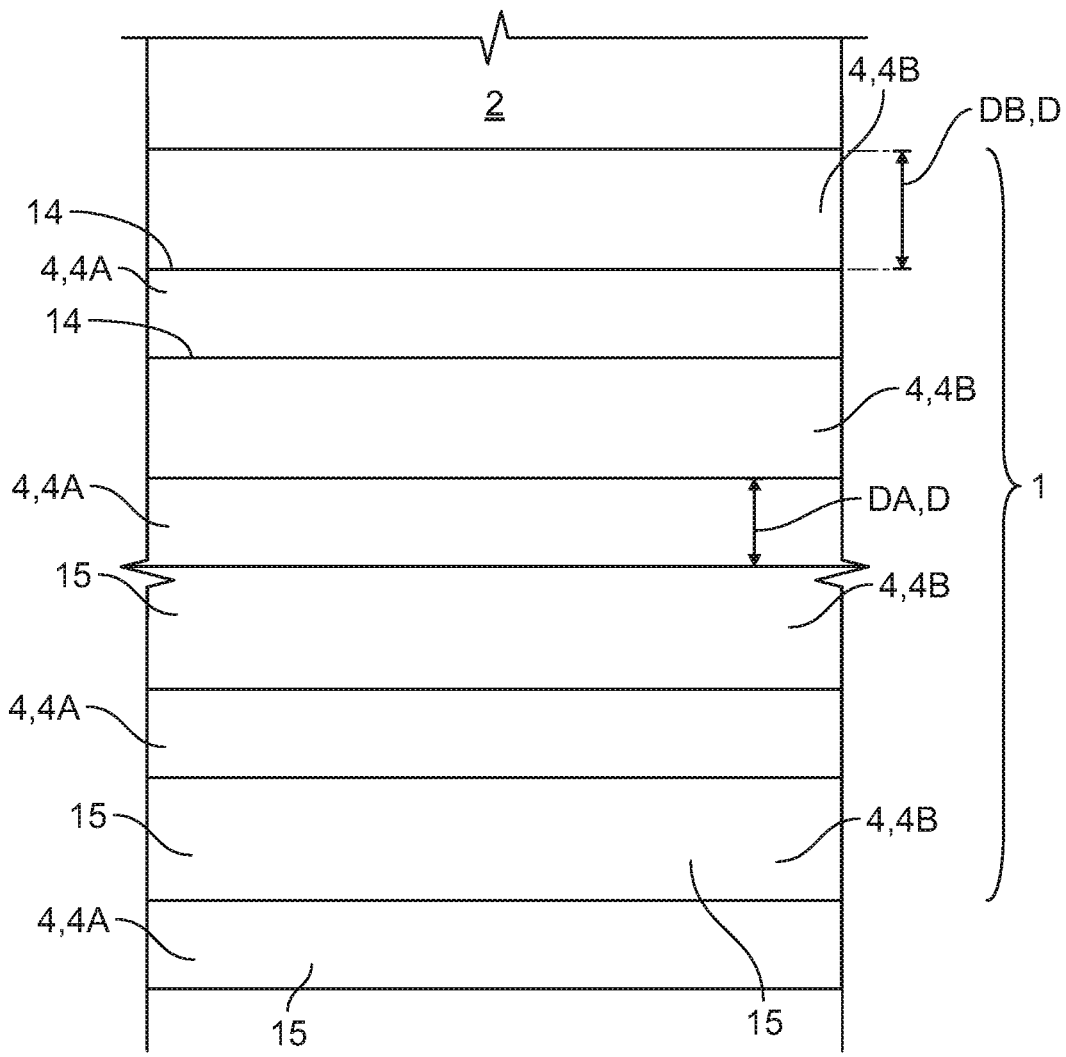
FIG. 2 is a sectional view of a substrate of the sensor assembly.

The substrate 1, as shown in FIG. 2, has several layers 4 including first and second layers 4A, 4B arranged over one another. The first and second layers 4A, 4B may be made of different materials. In the shown embodiment, the material of the first layer 4A is aluminum oxide and the material of the second layer 4B is magnesium oxide. Aluminum oxide and magnesium oxide react with one another and form hybrid shapes where they border one another; in other embodiments, the first and second layers 4A, 4B may be formed of materials which exhibit no reactions or formations of hybrid forms, for example, spinel and magnesium oxide or zirconium dioxide and aluminum oxide. The boundary region 14 is small compared to the core region 15, so that overall the behavior of the core regions 15 dominates.

The magnesium oxide layers 4B and the aluminum oxide layers 4A, as shown in FIG. 2, are disposed in an alternating manner. The magnesium oxide layers 4B have a thickness DB greater than a thickness DA of the aluminum oxide layers 4A. The sum of the thicknesses DB of the magnesium oxide layers 4B is approximately 110% of the sum of the thicknesses DA of the aluminum oxide layers 4A. In an embodiment, the sum of the thicknesses DB of all magnesium oxide layers 4B can also be between 80% and 120% of the sum of the thicknesses DA of all aluminum oxide layers 4A. As a result, the substrate 1 has a thermal coefficient of expansion which is adapted to correspond to the thermal coefficient of expansion of the platinum measuring structure 2. In an embodiment in which the first layers 4A are aluminum oxide and the second layers 4B are zirconium dioxide, the sum of the thicknesses DB of the zirconium dioxide layers 4B is approximately 150% of the sum of the thicknesses DA of the aluminum oxide layers 4A.

The substrate 1 can have a thermal coefficient of expansion which is approximately equal to that of platinum or in other words, deviates by a maximum of approximately 10% from the thermal coefficient of expansion of platinum. In other embodiments, an even lower deviation of 5%, 3%, 2% or less can be selected. The thermal coefficients of expansion of the substrate 1 and of the platinum measuring structure 2 can in particular deviate from one another within the specified ranges only in a region relevant for measuring, for example in a region in which the sensor assembly 7 is operated later, for instance from −50° C. to 1000° C. They may deviate further from one another outside such a region.

In an embodiment, the thickness DA, DB of the individual layers 4A, 4B is between 30 µm and 80 µm. As a result, no excessively large warping forces can build up between the layers 4A, 4B. At the same time, the boundary region 14 between the layers 4A, 4B is small compared to the thicknesses DA, DB of the layers 4A, 4B, which means that the core regions 15 of the layers 4A, 4B determine the behavior of the substrate 1.

In the embodiment shown in FIG. 2, the substrate 1 has eight layers 4. However, there can also be more or fewer layers 4 in the substrate 1. In order to be able to produce the substrate 1 efficiently and at the same time to obtain good functionality, a total of between 5 and 25 layers can be present. In another embodiment, approximately 9 to 15 layers are present.

The embodiment of FIG. 2 also shows that the thickness DB of each individual magnesium oxide layer 4B is approximately equal and the thickness DA of each aluminum oxide layer 4A is approximately equal, however, these thicknesses DB or DA could also vary among the layers 4B or 4A, respectively.

Figure 2A:
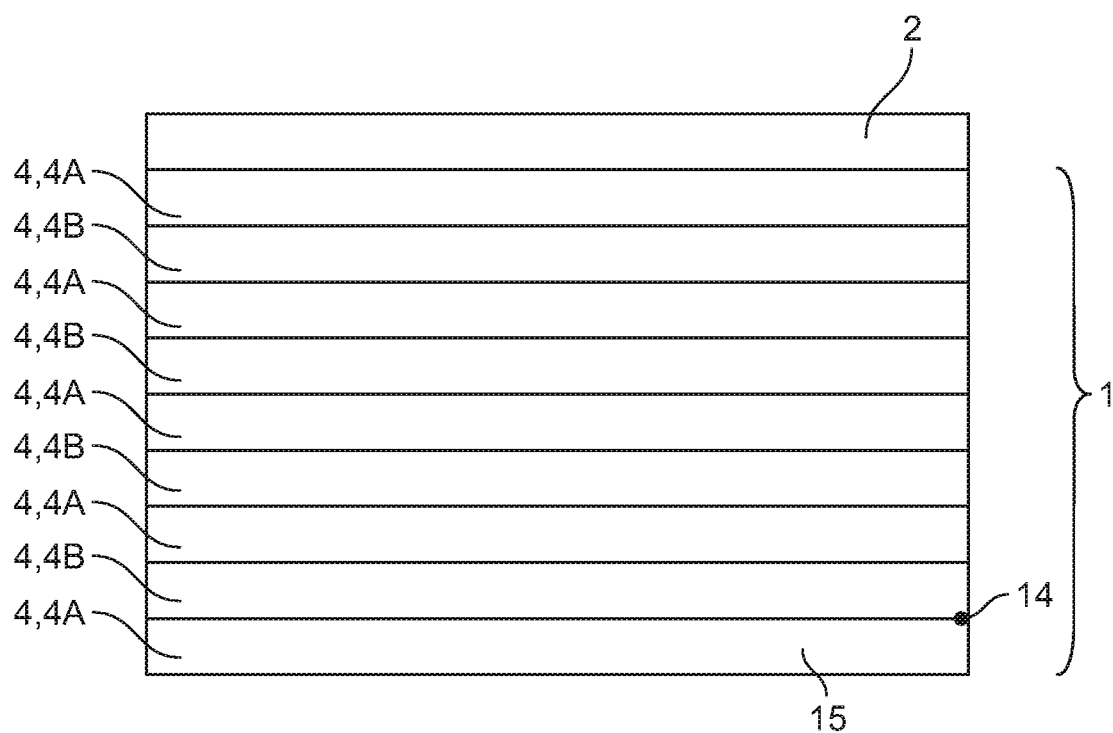
FIG. 2A is a sectional view of another substrate of the sensor assembly.

Another embodiment of the substrate 1 is shown in FIG. 2A. In the substrate 1 of FIG. 2A, an uppermost layer and a lowest layer consist of the same material 4A, aluminum oxide. In such a configuration, the substrate 1 remains free of warping due to the odd number of layers 4.

Figure 3:
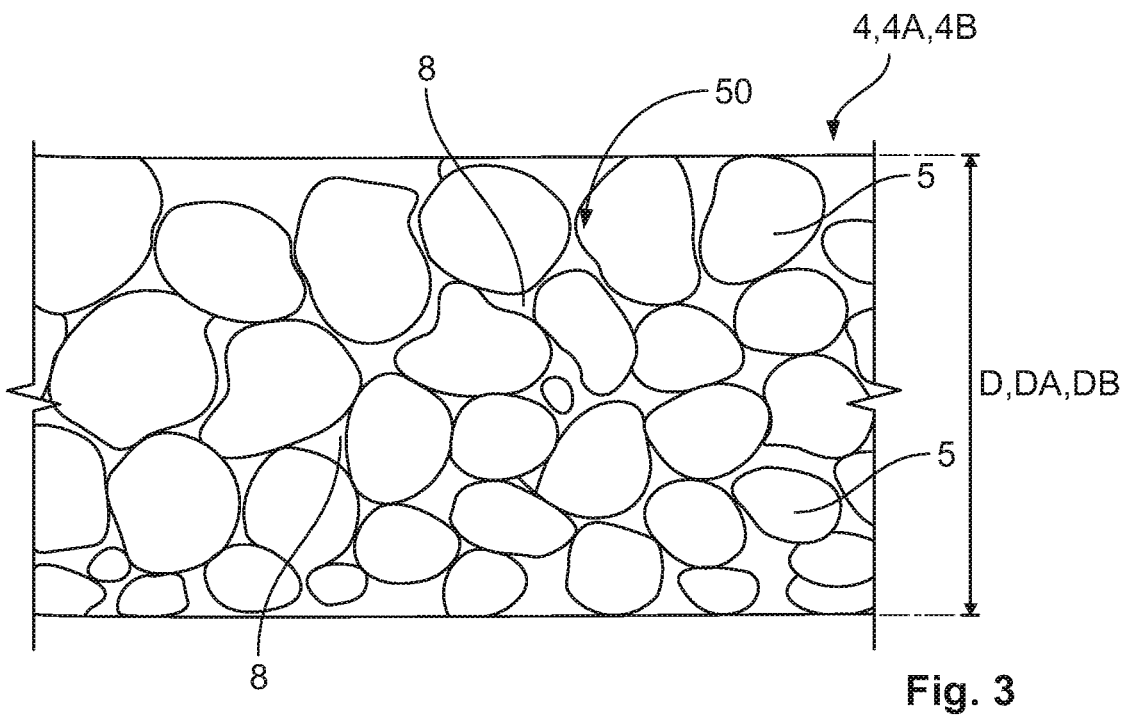
FIG. 3 is a sectional view of a layer of the substrate.
Figure 4:
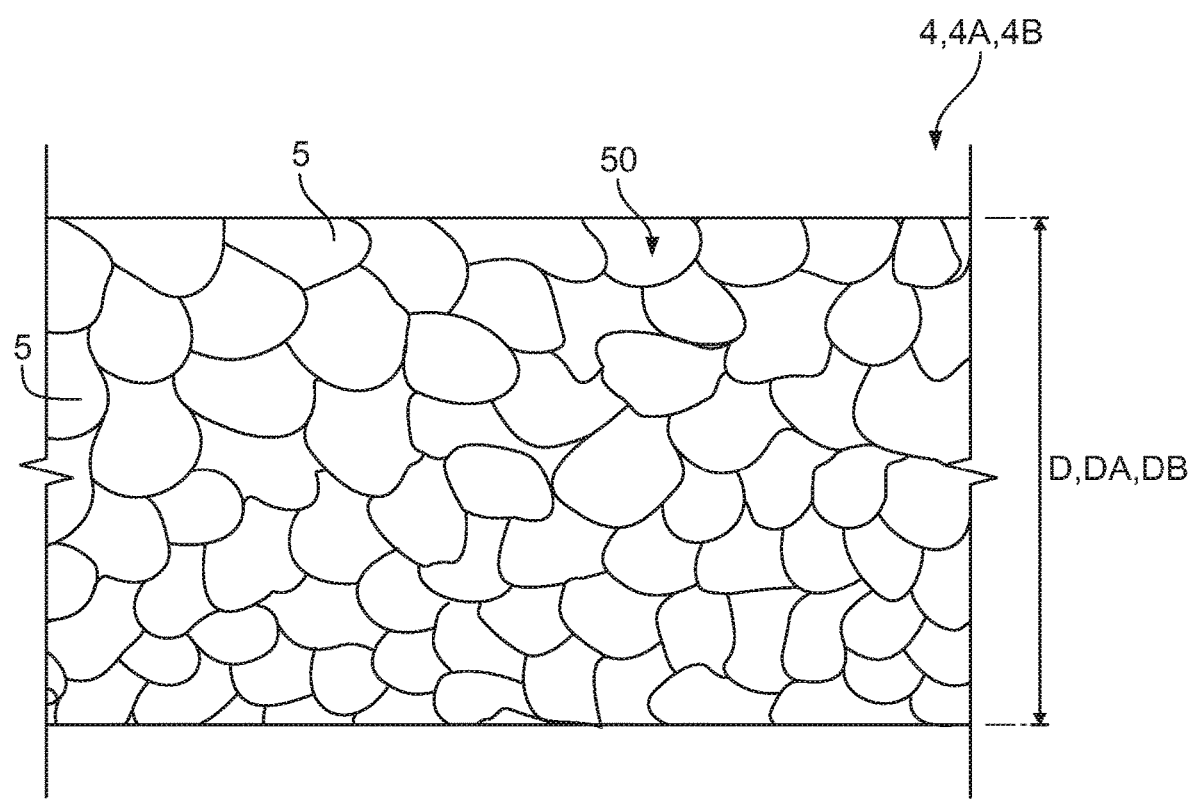
FIG. 4 is a sectional view of another layer of the substrate.

One individual layer 4, for example an aluminum oxide layer 4A or a magnesium oxide layer 4B, is shown in FIG. 3. The layer 4 has individual grains 5. For example, a powder may have been mixed with a solvent to form a paste and a layer 4 may have been formed from this paste. This may have been heated, for example, so that the individual grains 5 connect to one another and a stable layer 4 is produced. The solvent can be evaporated and gaps 8 may still be present between the grains 5 in the layer 4, forming a grain structure 50 of the layer 4. Another embodiment of a grain structure 50 of a layer 4 is shown in FIG. 4. In the grain structure of FIG. 4, the individual grains 5 are situated close together and there are no gaps present; this may be due to the layer 4 being more strongly compressed during production or the grains 5 partially melting during heating and filling all gaps.

In order to keep the surface of the substrate 1 sufficiently smooth, the grains 5 should not be too large. On the other hand the production of fine powders is complex. Consequently, in an embodiment, grains 5 between 1 µm and 50 µm are used. In other embodiments, grains 5 up to 0.1 µm or up to 100 µm may also be used.

Figure 5:
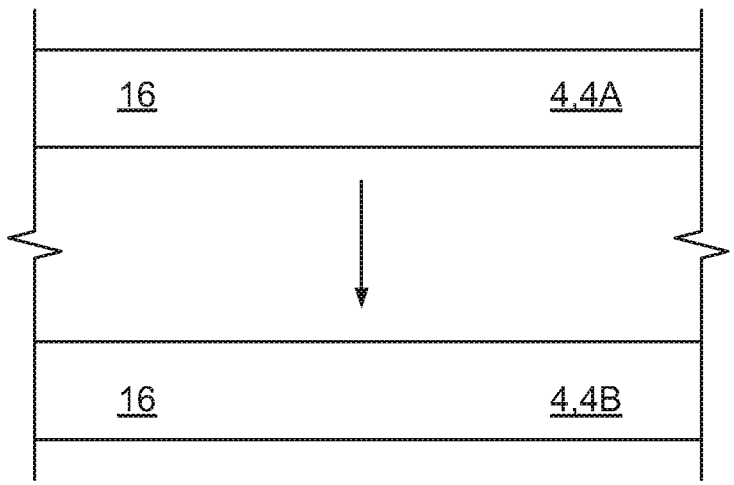
FIG. 5 is a schematic of a method of producing the substrate.

A method of producing a substrate 1 is shown in FIG. 5. The layers 4 present as foil material 16 are mechanically deposited on one another. The upper layer 4, an aluminum oxide layer 4A here, is laid onto the lower layer 4, here a magnesium oxide layer 4B. The two layers 4 have been produced individually in advance. For example, a paste or suspension can be applied thinly. After a stabilization step, in which a stabilization has taken place through heating, for example, one layer 4 may be deposited onto the other layer 4 for example by laying it on. If several of these layers 4 are deposited on one another, the formed substrate 1 may be heated after a possible mechanical compression step for a better connection. This subsequent heating can take place at a higher temperature.

Figure 6:
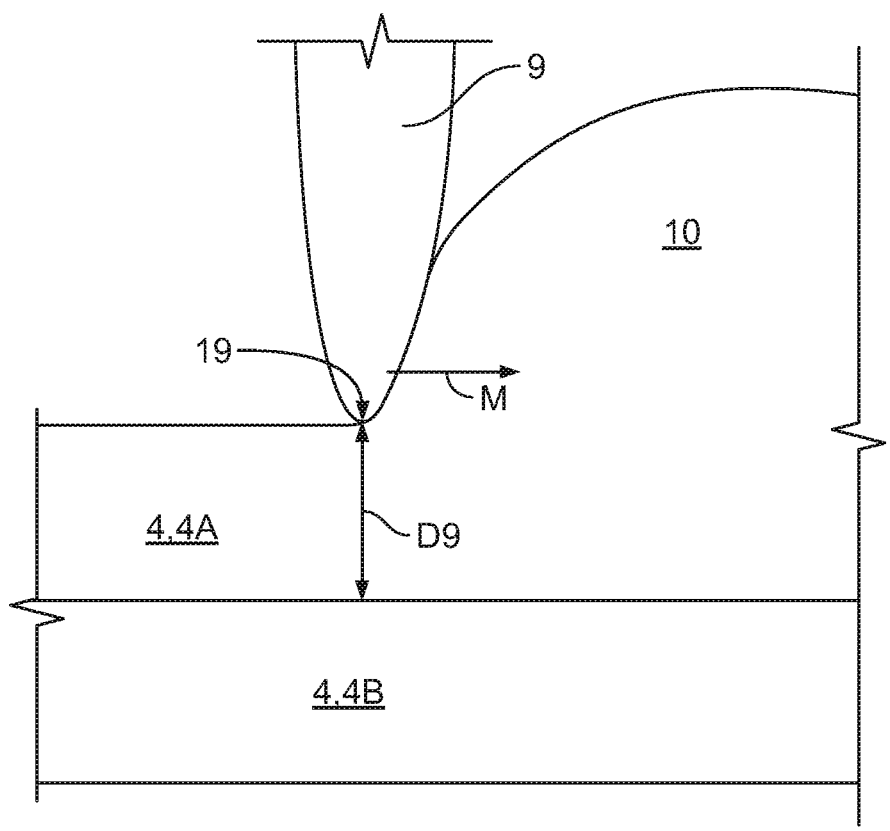
FIG. 6 is a schematic of another method of producing the substrate.

A method of producing a substrate 1 according to another embodiment is shown in FIG. 6. In the method of FIG. 6, an upper layer 4A, such as an aluminum oxide layer 4A, is deposited onto an already present lower layer 4B, such as a magnesium oxide layer 4B. The upper layer 4A is produced by applying a paste 10 with a tool 9. The tool 9 moves along a direction of movement M with a tip 19 of the tool 9 at a suitable spacing D9 over the lower layer 4B. The upper layer 4A created as a result can be stabilized easily, for example, by heating. Additional layers 4 may then be deposited.

Figure 7:
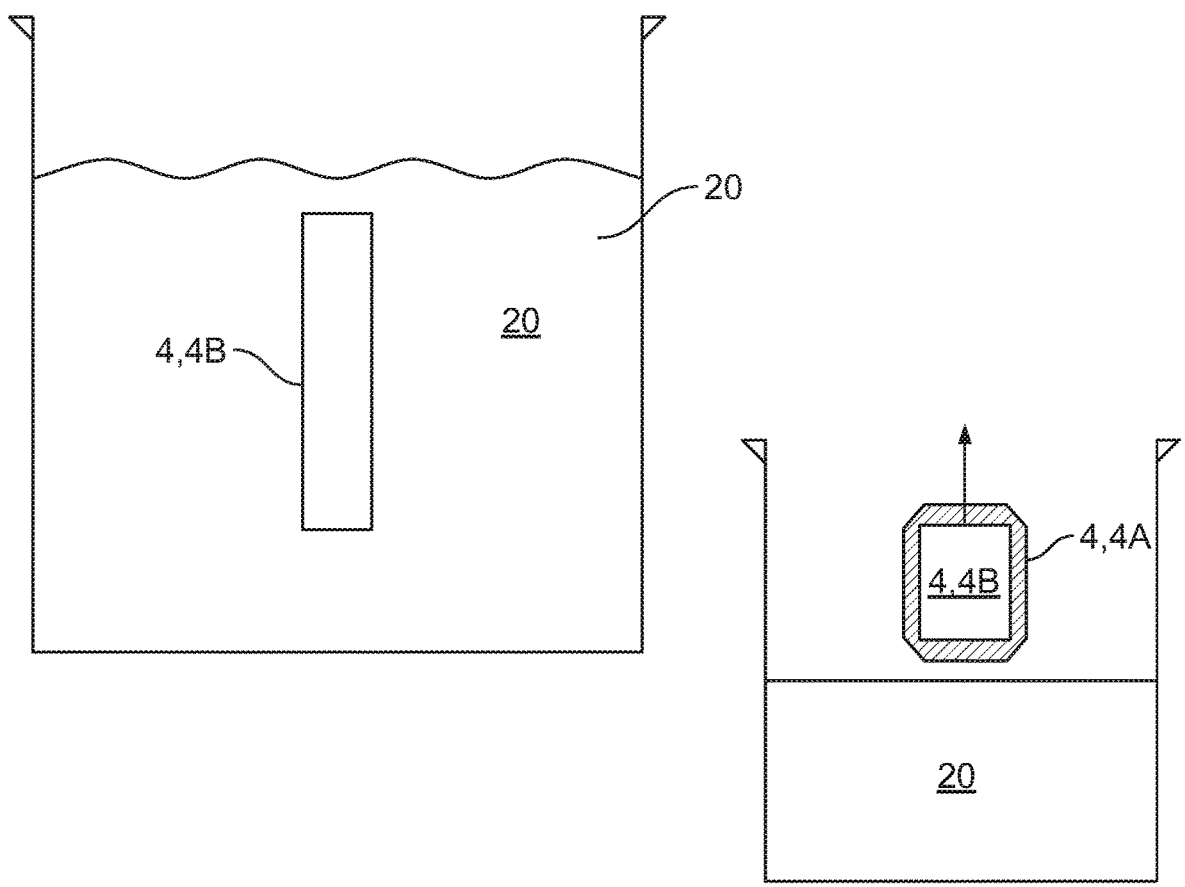
FIG. 7 is a schematic of another method of producing the substrate.

A method of producing a substrate 1 according to another embodiment is shown in FIG. 7. In this case, upper layers 4A, such as aluminum oxide layers 4A, are deposited on an already present lower layer 4B, such as a magnesium oxide layer 4B, through a dipping process in a suspension 20 or in a molecular solution. The substrate 1 is moved out of the solution at a uniform speed. The upper layers 4A created as a result can be stabilized easily by heating. Additional layers 4 may then be deposited, or these layers 4 may already form the substrate 1 required for the platinum measuring structure.

In other embodiments of the substrate 1, more than two layers 4 made of more than two materials can be present. For example, three layers 4 made of three materials can be present, which with regard to their thicknesses are formed such that the weighted thermal coefficient of expansion of the three materials is in line with the thermal coefficient of expansion of the platinum. In another embodiment, the layers 4 may alternatively be deposited by sputter deposition. In order to protect the sensor assembly 7, in an embodiment, the cover layer 3 can be completely or partially disposed over the sensor assembly 7. This cover layer 3 too can have the inventive construction in layers. In another embodiment, an electrical insulation layer can be present between the substrate 1 and the measuring structure 2, for instance to obtain good insulation at high or low temperatures, if, as a result of the selected layer construction, there is no completely insulating layer at the boundary surface between the substrate 1 and the measuring structure 2.

Advantageously, in the substrate 1 of the sensor assembly 7 for a resistance thermometer according to the invention, the substrate 1 has a thermal coefficient of expansion which is adapted to correspond to the thermal coefficient of expansion of the platinum measuring structure 2, avoiding damage or tears due to different thermal coefficients of expansion.

If an attempt were made to adapt the substrate 1, with regard to its thermal coefficient of expansion, to the platinum by mixing magnesium oxide powder and aluminum oxide powder, for example, in a ratio which mathematically leads to a coefficient of expansion which corresponds to that of the platinum, then this would not be successful because the magnesium oxide and the aluminum oxide react with one another at the boundary layers of the powder grains and the coefficient of expansion of this mixture deviates from the coefficient of expansion to be expected. In order to reach a desired thermal coefficient of expansion, complex series of experiments consequently have to be carried out in order to find a suitable mixture. Through the arrangement of the inventive substrate 1 in layers 4, the size of the boundary regions 14 is significantly reduced so that the first material and the second material can react only in a small region, and the thermal coefficient of expansion of the entire system is situated close to the mathematical average of the weighted two coefficients of expansion of the first and second layers. The substrate 1 can thus be produced in which the thermal coefficient of expansion is adapted to that of the platinum without carrying out a complex series of experiments.

What is claimed is:

1. A substrate for a sensor assembly of a resistance thermometer, comprising:

a plurality of first layers formed of a first material; and a plurality of second layers formed of a second material, the first and second layers disposed over one another such that a thermal coefficient of expansion of the substrate is approximately equal to the thermal coefficient of expansion of platinum.

2. The substrate of claim 1, wherein the first and second layers are disposed in an alternating manner.

3. The substrate of claim 1, wherein a total number of the first and second layers is between 5 and 25 layers.

4. The substrate of claim 1, wherein the first material is aluminum oxide and the second material is magnesium oxide.

5. The substrate of claim 4, wherein a sum of thicknesses of the second layers is approximately 110% of a sum of thicknesses of the first layers.

6. The substrate of claim 4, wherein the plurality of first and second layers comprise:
a first layer of aluminum oxide;
a second layer of magnesium oxide surrounding the first layer;
a third layer of aluminum oxide surrounding the second layer; and
a fourth layer of magnesium oxide surrounding the third layer.

7. The substrate of claim 1, wherein the first material is aluminum oxide and the second material is zirconium dioxide.

8. The substrate of claim 7, wherein a sum of thicknesses of the second layers is approximately 150% of a sum of thicknesses of the first layers.

9. The substrate of claim 1, wherein a thickness of each of the first layers and each of the second layers is between 30 μm and 80 μm.

10. The substrate of claim 1, wherein at least one of the first and second layers has a grain structure.

11. A sensor assembly of a resistance thermometer, comprising:
a substrate having a plurality of first layers formed of a first material and a plurality of second layers formed of a second material, the first and second layers disposed over one another; and
a measuring structure disposed on the substrate, a thermal coefficient of expansion of the substrate adapted to correspond to a thermal coefficient of expansion of the measuring structure.

12. The sensor assembly of claim 11, wherein the measuring structure is formed of platinum.

13. The sensor assembly of claim 12, further comprising an insulation layer disposed between the substrate and the measuring structure.

14. A resistance thermometer, comprising:
a sensor assembly having a substrate including a plurality of first layers formed of a first material and a plurality of second layers formed of a second material, the first and second layers disposed over one another, and a measuring structure disposed on the substrate, a thermal coefficient of expansion of the substrate adapted to correspond to a thermal coefficient of expansion of the measuring structure.

15. The resistance thermometer of claim 14, wherein the measuring structure is formed of platinum.

16. The resistance thermometer of claim 14, wherein the substrate comprises an odd number of layers, and wherein an uppermost layer of the substrate and a lowermost layer of the substrate each comprise first layers of aluminum oxide.

17. A method for producing a substrate for a sensor assembly of a resistance thermometer, comprising:
providing a plurality of first layers formed of a first material and a plurality of second layers formed of a second material; and
arranging the first and second layers over each other such that a thermal coefficient of expansion of the substrate is approximately equal to the thermal coefficient of expansion of platinum.

18. The method of claim 17, wherein one of the first layers is constructed by depositing the first material in powder, paste, or suspension form onto a pre-existing one of the second layers.

19. The method of claim 18, wherein the first material is at least partially stabilized after the deposition.

20. The method of claim 17, wherein one of the first layers or second layers is constructed by the mechanical deposition of a foil material.

21. The method of claim 20, wherein the foil material is produced from a powder, a paste, or a suspension.

22. The method of claim 17, wherein the steps of providing a plurality of first layers formed of a first material and a plurality of second layers formed of a second material, and arranging the first and second layers over each other, comprises:
forming a first layer of aluminum oxide;
submerging the first layer into a solution of magnesium oxide for forming a second layer of magnesium oxide surrounding the first layer;
removing the submerged first layer and second layer from the solution at a uniform speed;
heating the second layer; and
submerging the first layer and the second layer into the solution of aluminum oxide for forming a third layer surrounding the second layer.

* * * * *